(12) United States Patent
Gotou

(10) Patent No.: US 6,311,047 B1
(45) Date of Patent: Oct. 30, 2001

(54) GAIN CONTROL METHOD AND CIRCUIT

(75) Inventor: Kazuhumi Gotou, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/185,331

(22) Filed: Nov. 3, 1998

(30) Foreign Application Priority Data

Nov. 3, 1997 (JP) .................................................. 9-316490

(51) Int. Cl.$^7$ ............................... H04B 1/06; H04B 7/00; H04L 27/08

(52) U.S. Cl. ..................... 455/234.1; 455/245.1; 375/345

(58) Field of Search ............................... 455/234.1, 234.2, 455/240.1, 245.1, 232.1, 69; 375/345, 354

(56) References Cited

U.S. PATENT DOCUMENTS

| | | | |
|---|---|---|---|
| 5,361,395 | * | 11/1994 | Yamamoto ..................... 455/234.1 X |
| 5,369,792 | * | 11/1994 | Matsumoto et al. .......... 455/245.1 X |
| 5,513,386 | * | 4/1996 | Ogino et al. ....................... 455/234.1 |
| 5,838,733 | * | 11/1998 | Bruckert ............................ 375/345 X |
| 5,884,152 | * | 3/1999 | Matsumoto ........................ 455/234.1 |

FOREIGN PATENT DOCUMENTS

| | | |
|---|---|---|
| 2-108332 | 4/1990 | (JP) . |
| 2-280515 | 11/1990 | (JP) . |
| 3-258059 | 11/1991 | (JP) . |
| 4-150232 | 5/1992 | (JP) . |

* cited by examiner

Primary Examiner—Tracy Legree
(74) Attorney, Agent, or Firm—Scully, Scott, Murphy & Presser (57) ABSTRACT

A gain control circuit controls the gain of a variable-gain amplifier for amplifying a radio-frequency signal having at least one of a plurality of predetermined transmission rates is controlled. A received signal level is detected from a received signal amplified by the variable-gain amplifier and a transmission rate of the received signal is determined. Then, the gain of the variable-gain amplifier is controlled depending on a gain control adjusting signal produced based on the received signal level and the transmission rate of the received signal.

11 Claims, 7 Drawing Sheets

GAIN CONTROL METHOD AND CIRCUIT

BACKGROUND OF THE INVENTION

1. Field of the Invention

The present invention relates to a radio receiver that is operable with respect to different transmission rates and, more particularly, to a circuit and method for automatically controlling the gain of a radio received signal.

2. Description of the Related Art

With a recent increase in the number of subscribers to a radio selective calling system, an increase in the transmission rate (hereinafter referred to as "bit rate") has been attempted. By increasing the bit rate, it is possible to increase the amount of data received and thereby prevent a rise In the channel occupation factor. There has been proposed a method of changing the bit rate during transmission of a transmission signal to achieve the increased amount of transmission data.

Also, it has been known that the intermodulation (IM) caused by a high electric field of the adjacent frequency channel has a bad effect upon the receiving characteristics of the current channel in use. In order to suppress such intermodulation interference, a radio selective call receiver is generally provided with an automatic gain control (AGC) circuit for use in countermeasure against the intermodulation. More specifically, such an AGC circuit controls a high-frequency amplifier such that its gain decreases as the input level of the demodulator is increased.

Meanwhile, it has been known that the input level of the demodulator becomes higher in proportion to the increase in the bit rate. Therefore, when constructing the AGC circuit for use in countermeasure against the intermodulation, it is also necessary to take the problems resulting from such phenomenon into consideration.

For example, in Japanese Patent Application Laid-Open Publication No. 4-150232, there has been proposed a demodulator that is provided with a plurality of attenuators, one of which is selected depending on the bit rate. Such a conventional demodulator can solve the problem that the dynamic range of the AGC circuit enlarges with an increase in the bit rate.

However, there are developed drawbacks in the conventional AGC circuit which controls a high-frequency amplifier such that its gain decreases as the input level of the demodulator is increased. Since the operating point is fixed to a single point regardless of the bit rate. there were the problems that when the bit rate was changed, the sensitivity was unnecessarily decreased, the necessary gain control became inoperative, etc.

For example, when a radio selective calling signal has been changed from a low bit rate to a high bit rate, the input level of the demodulator increases. As a result, the AGC circuit operates with the result that the gain of the high frequency amplifier decreases, which results in a degradation of the receiving sensitivity at the high bit-rate time. To prevent this, when setting the operating point of the AGC circuit in conformity with the received signal level at the high bit-rate time. the AGC circuit does not operate this time at the low bit-rate time unless the input level is high.

Also, in the construction provided with an attenuator for each of a plurality of bit rates, disclosed in Japanese Patent Application Laid-Open No. 4-150232, it is difficult to promote the miniaturization and simplification of the circuit.

SUMMARY OF THE INVENTION

An object of the present invention is to provide gain control circuit and method which can achieve a high reliability without increasing in complexity of the circuit of the radio receiver.

According to the present invention, a variable-gain amplifier for amplifying a radio-frequency signal having at least one of a plurality of predetermined transmission rates is controlled. A received signal level is detected from a received signal amplified by the variable-gain amplifier and a transmission rate of the received signal is determined. Then, a gain of the variable-gain amplifier is controlled depending on a gain control adjusting signal produced based on the received signal level and the transmission rate of the received signal.

The gain control adjusting signal may be produced as follows: determining an amount of change depending on the transmission rate of the received signal so as to cancel out a change of the received signal level caused by a change of the transmission rate; and changing the received signal level by the amount of change to produce the gain control adjusting signal The gain of the variable-gain amplifier may be controlled when a level of the gain control adjusting signal is higher than a predetermined level regardless of the transmission rate.

According to the present invention, the received signal level is not directly used for gain control. Namely, the adjustment of the received signal level is performed depending on the transmission rate of the received signal, whereby it is possible to easily cope with the fluctuation in the received signal level due to a change in the transmission rate.

Further, it is possible to easily set the gain control starting point by the adjustment of the received signal level. At this time, if the gain of the variable gain amplifier is controlled when the gain control adjusting signal has risen up to a level not lower than a predetermined operating level independently from the transmission rate, it is possible to easily set the operation-starting point for the automatic gain control according to the transmission rate to perform more stable gain control.

DETAILED DESCRIPTION OF THE PREFERRED EMBODIMENT

Figure 1:
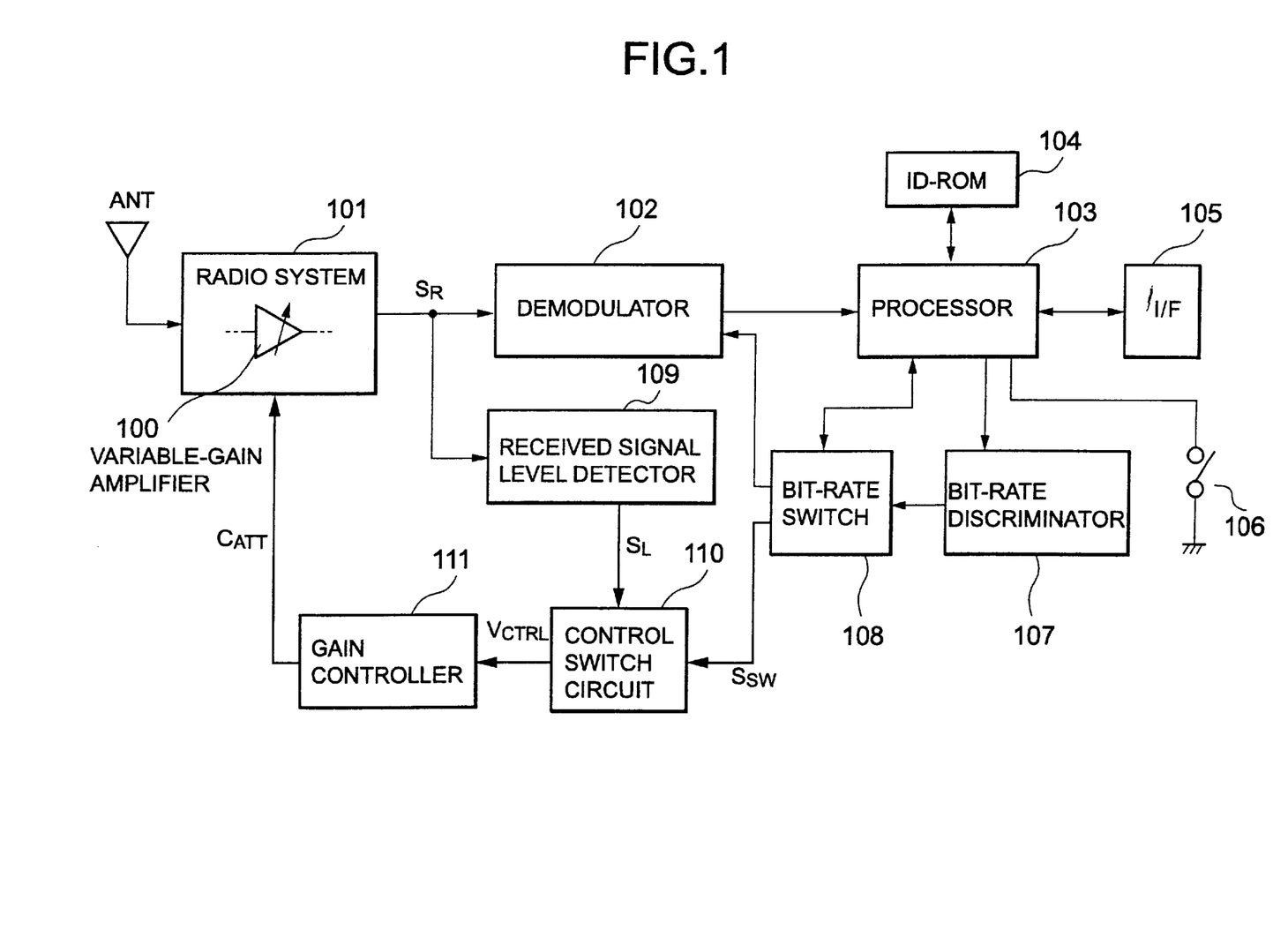
FIG. 1 is a block diagram illustrating a radio selection call signal receiver according to an embodiment of the present invention.

Referring to FIG. 1, a radio system 101 includes a variable-gain high-frequency amplifier 100 for amplifying a radio-frequency signal that has been received through an antenna. The radio system 101 further has other necessary circuits including a frequency converter for converting the radio frequency to an Intermediate frequency. A received signal $S_R$ which is an output signal of the radio system 101 is demodulated by a demodulator 102 into a base band signal. The demodulator 102 is designed to selectively demodulate the received signals having a plurality of different bit rates. An explanation will hereafter be given of a case where three bit rates of 1600 bps, 3200 bps and 6400 bps are set, as an example.

The base band signal that has been demodulated by the demodulator 102 is output to a processor 103 in which decoding and other signal processings are performed. After decoding the base band signal and thereby producing received data, the processor 103 compares a selective calling number contained in the received data and an identification number stored in an identification number memory (ID-ROM) 104 to thereby determine whether the received data is addressed to the present receiver self. If the received data is addressed to this receiver self, the processor 103 informs a user of an incoming call through an interface 105 such as an alarm, liquid crystal display, etc. to thereby display the received message and other necessary information on screen. The processor 103 also performs the reception control of the radio selective call receiver. For example, the processor 103 performs the control of the intermittent receiving operation or battery saving (BS) operation of the radio system 101. Namely, the radio system 101 outputs the received signal $S_R$ during the receiving operation (BS-OFF) period and, during the (BS-ON) operation period, performs no receiving operation.

A bit-rate discriminator 107 detects bit-rate information from the sync section of the received data and thereby determines the bit rate of a message field of the received data and then outputs it to a bit-rate switch 108. According to the control of the processor 103, the bit-rate switch 108 generates a bit-rate switch signal for switching the set states of the demodulator 102 and control switch circuit 110. The bit-rate switch signal causes the demodulator 102 and the control switch circuit 110 to be set to the bit rate determined by the bit-rate discriminator 107.

A received signal level detector 109 inputs the received signal $S_R$ from the radio system 101 and detects a received signal level $S_L$ to output it to the control switch circuit 110. According to a bit rate switch signal $S_{SW}$ from the bit-rate switch 108, the control switch circuit 110 performs the adjustment of the received signal level $S_L$ to produce the gain control adjusting voltage $V_{CTRL}$ and outputs it to a gain controller 111. The gain controller 111 has control characteristics preset therein as later described (refer to FIG. 4). When the gain control adjusting voltage $V_{CTRL}$ is higher than a predetermined voltage, the gain controller 111 outputs an attenuation control signal $C_{ATT}$ corresponding to the control characteristic to the variable-gain amplifier 100 of the radio system 101. In the present invention. the gain control adjusting voltage $V_{CTRL}$ is not input from the received signal level detector 109 but from the control switch circuit 110. Depending on the gain control adjusting voltage $V_{CTRL}$, control is performed of the gain of the variable-gain amplifier 100 of the radio system 101.

Figure 2:
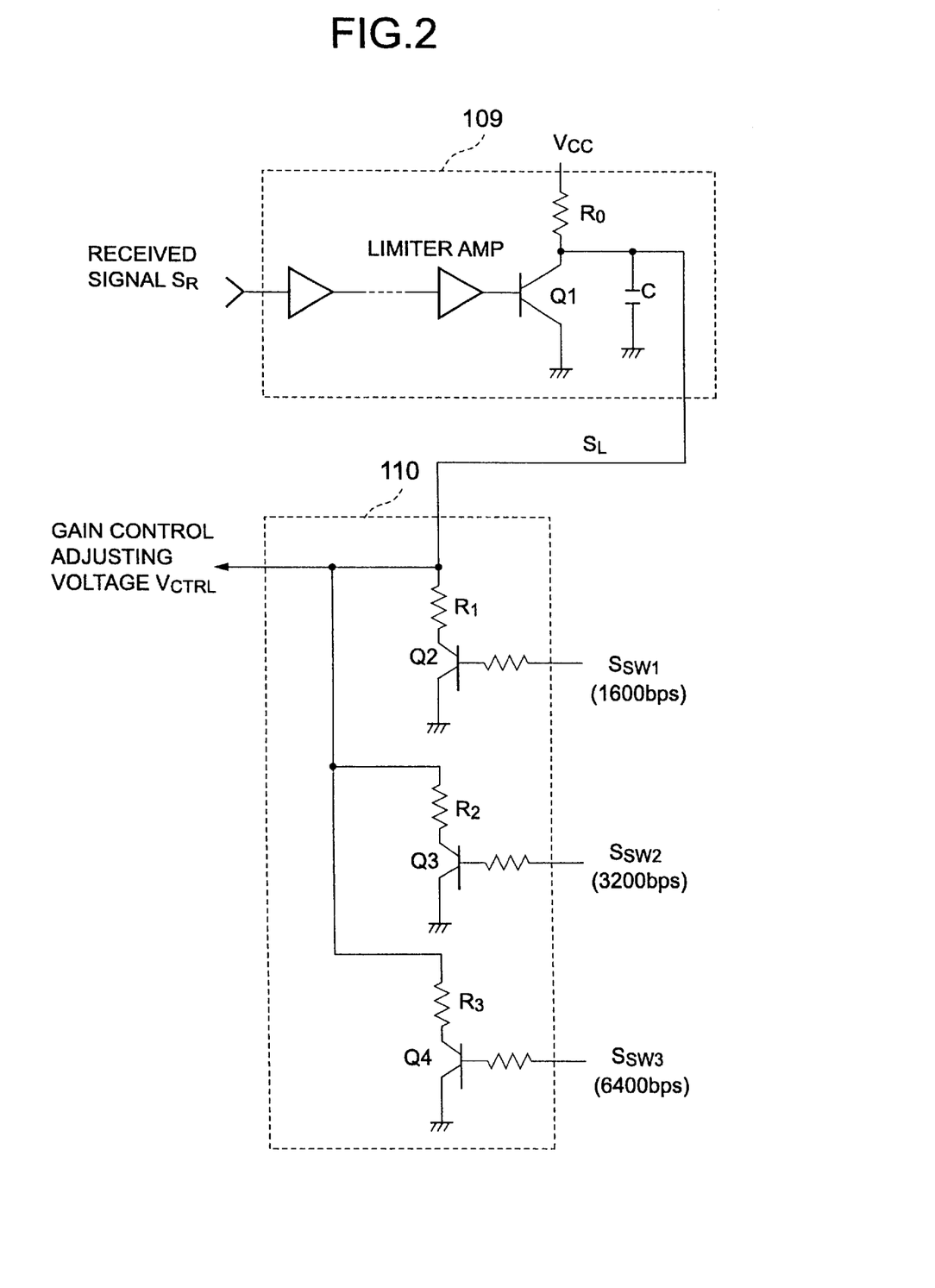
FIG. 2 is a detailed circuit diagram illustrating an example of a received signal level detector 109 and control switch circuit 110.

Referring to FIG. 2, the received signal level detector 109 has an amplifier circuit for amplifying the received signal $S_R$ and has a limiter amplifier at a final stage of the amplifier circuit. The output of the limiter amplifier is connected to the base of an NPN transistor Q1. Also, the emitter of the NPN transistor Q1 is grounded and the collector thereof is connected to a power supply voltage $V_{CC}$ through a resistor $R_0$. And the collector is grounded through a capacitor C. The collector of the NPN transistor Q1 that is constructed in this way serves as an output terminal of the received signal level detector 109.

The received signal $S_R$ having an intermediate frequency that has been output from the radio system 101 is amplified by the amplifier circuit and thereafter is input to the base of the NPN transistor Q1. In the NPN transistor Q1, while the collector current flows in accordance with the base current, the collector current is smoothed by way of the time constant of the resistor $R_0$ and capacitor C. Therefore, the current flowing through the resistor $R_0$ becomes a DC current reflecting the amplitude of the received signal $S_R$ and is output to the control switch circuit 110 as the received signal level $S_L$.

The control switch circuit 110 is composed of NPN transistors Q2 to Q4 and resistors R1 to R3 having different resistance values. The emitters of the NPN transistors Q2 to Q4 are respectively grounded and the collectors thereof are connected to the output terminal of the received signal level detector 109 through the resistors R1 to R3, respectively. The respective bases of the NPN transistors Q2 to Q4 input the bit-rate switch signals $S_{SW1}$, $S_{SW2}$ and $S_{SW3}$ which have been produced in the bit-rate switch 108. Here, the bit-rate switch signals $S_{SW1}$, $S_{SW2}$ and $S_{SW3}$ correspond to 1600 bps, 3200 bps and 6400 bps, respectively. Depending on the bit-rate switch signals $S_{SW1}$, $S_{SW2}$ and $S_{SW3}$, one of the NPN transistors Q2 to Q4 is forced into conduction, that is, becomes in ON state.

For example, when it has been determined that the bit rate of the received signal is 1600 bps, the bit-rate switch signals only one $S_{SW1}$ of which has a high level and the remaining ones $S_{SW1}$ and $S_{SW3}$ of which have low levels are output from the bit-rate switch 108. As a result, only the NPN transistor Q2 alone becomes in ON state and the remaining transistors become in OFF state. In this case, since the received signal level $S_L$ which is a direct current flows through the resistor R1 of the NPN transistor Q2, a voltage that corresponds to the resistance value of the resistor R1 is generated across the resistor R1 and this voltage is output to the gain controller 111 as the gain control adjusting voltage $V_{CTRL}$.

Similarly, when it has been determined that the bit rate of the received signal is 3200 bps, since only the bit-rate switch signals $S_{SW2}$ has a high level and the remaining signals $S_{SW1}$ and $S_{SW3}$ both have low levels. As a result, only the NPN transistor Q3 alone becomes "on" and the remaining transistors become "off". In this case, since the received signal level $S_L$ which is a direct current flows through the resistor R2 of the NPN transistor Q3, a voltage that corresponds to the resistance value thereof is output to the gain controller 111 as the gain control adjusting voltage $V_{CTRL}$. When it has been determined that the bit rate of the received signal is 6400 bps, also, similarly, only the bit-rate switch signal $S_{SW3}$ alone has a high level and, in response to the received signal level $S_L$ that flows through the resistor R3 of the NPN transistor Q4, the voltage that corresponds to the resistance value thereof is output to the gain controller 111 as the gain control adjusting voltage $V_{CTRL}$.

Accordingly, the gain control adjusting voltage $V_{CTRL}$ is obtained by adjusting the received signal level $S_L$ depending on the bit rate. In other words. the control switch circuit 110 can output a different gain control adjusting voltage $V_{CTRL}$ according to the bit-rate switch signals $S_{SW1}$, $S_{SW2}$ and $S_{SW3}$, i.e., according to the bit rate by setting of the resistors R1 to R3 to their respective appropriate values. The respective resistance values of the resistors R1 to R3 can be so set as to cancel the change in the output level of the radio system 101 due to a change in the bit rate.

Figure 3:
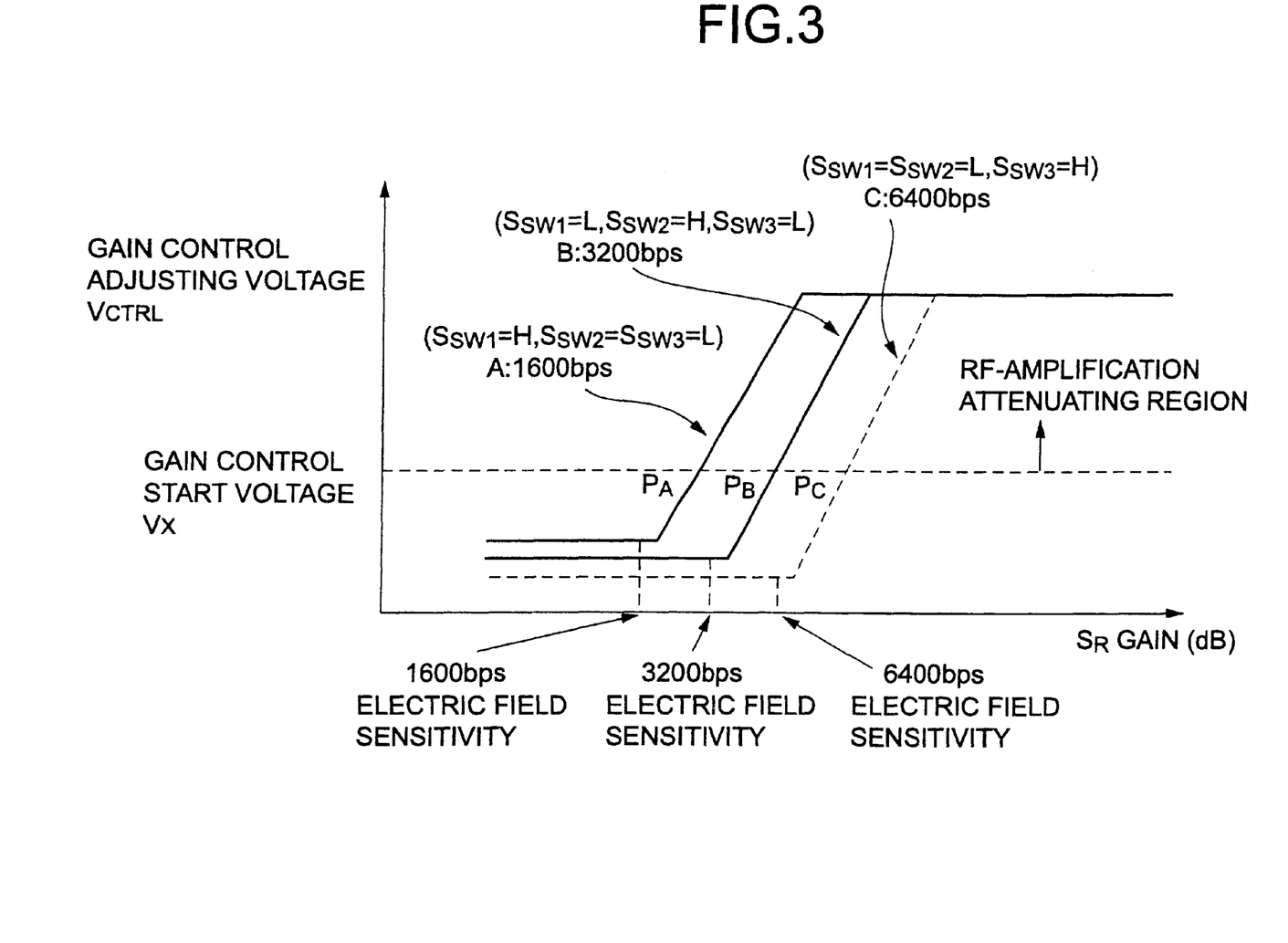
FIG. 3 is a graph illustrating a characteristic curve of a gain control adjusting voltage $V_{CTRL}$ output from the control switch circuit 110 relative to the gain (dB) of a received signal $S_R$ output from a radio system 101.

Referring to FIG. 3, as the bit rate of the received signal increases in such a way as 1600 bps, 3200 bps and 6400 bps, the received electric field sensitivity (i.e., the level of the received signal $S_R$) increases. Accordingly, in order to perform the same gain control at all times regardless of a change in bit rate, it is necessary to shift the characteristic curve of the gain control adjusting voltage $V_{CTRL}$ according to the bit rate as indicated by the illustrated curves A (1600 bps), B (3200 bps) and (6400 bps). In other words, it is sufficient to set the respective resistance values of the resistors R1 to R3 of the control switch circuit 110 so that such characteristic curves A, B and C may be obtained.

For example, in a case where the transmission rate is 1600 bps, the gain control adjusting voltage $V_{CTRL}$ is generated relative to the change in the level of the received signal $S_R$ along the characteristic curve A, whereby the gain control is performed. However, when the transmission rate is changed to 3200 bps, a change is made to the gain control along the characteristic curve B. Accordingly, even when the bit rate is changed, it is possible to perform the gain control that is suitable for the changed bit rate.

Figure 4:
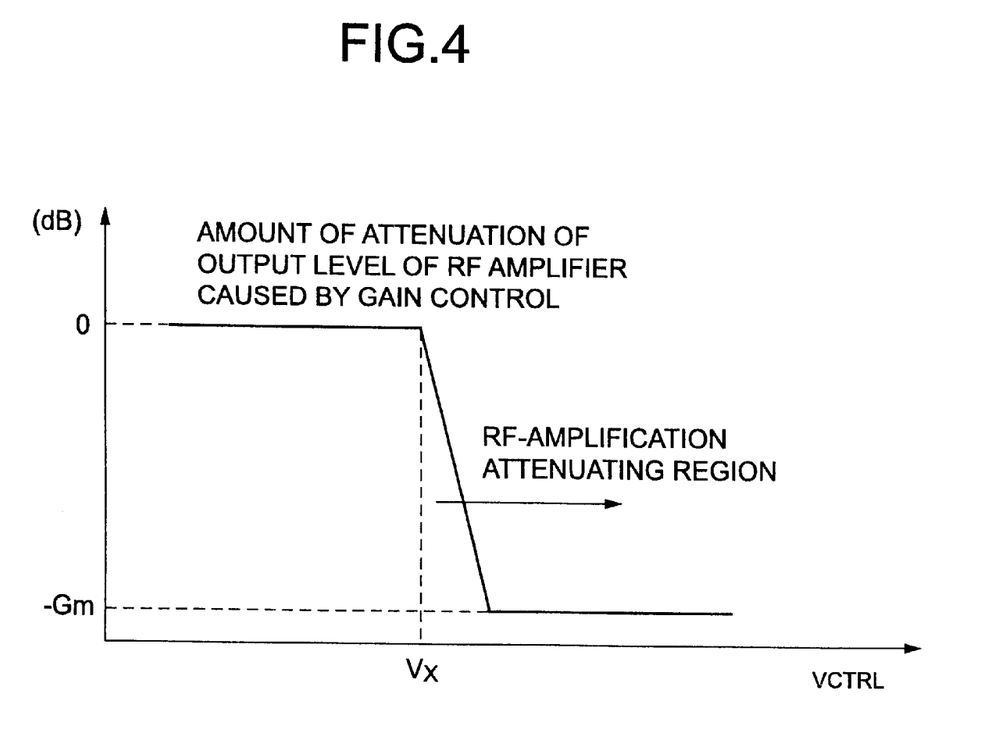
FIG. 4 is a characteristic graph of a gain controller 111 illustrating the amount of attenuation of the amplified level of a variable gain high frequency amplifier relative to the gain control adjusting voltage $V_{CTRL}$.

As illustrated in FIG. 4, the gain controller 111 of this embodiment performs the gain control, i.e., the amplification attenuating control of the variable-gain amplifier 100 when the gain control adjusting voltage $V_{CTRL}$ is not lower than a predetermined voltage $V_x$. In other words, the region where $V_{CTRL} \geq V_x$ is the operating region of the gain controller 111. The voltage $V_x$ is higher than the respective electric field sensitivity starting points corresponding to the bit rates.

Accordingly, as illustrated in FIG. 3, the operation-starting points of the gain controller 111 are set at the positions that are remote from the vicinities of the electric field sensitivity starting points of the respective bit rates and that are shifted therefrom to the points $P_A$, $P_B$ and $P_C$ according to the bit rates. As a result of this, there is no possibility that the gain control will be started at around each of the electric field sensitivity starting points.

In addition, even when a change occurs in the bit rate, it is possible to perform a stable gain control of the RF amplifier 100 with the same characteristic as shown in FIG. 4.

Figure 5:
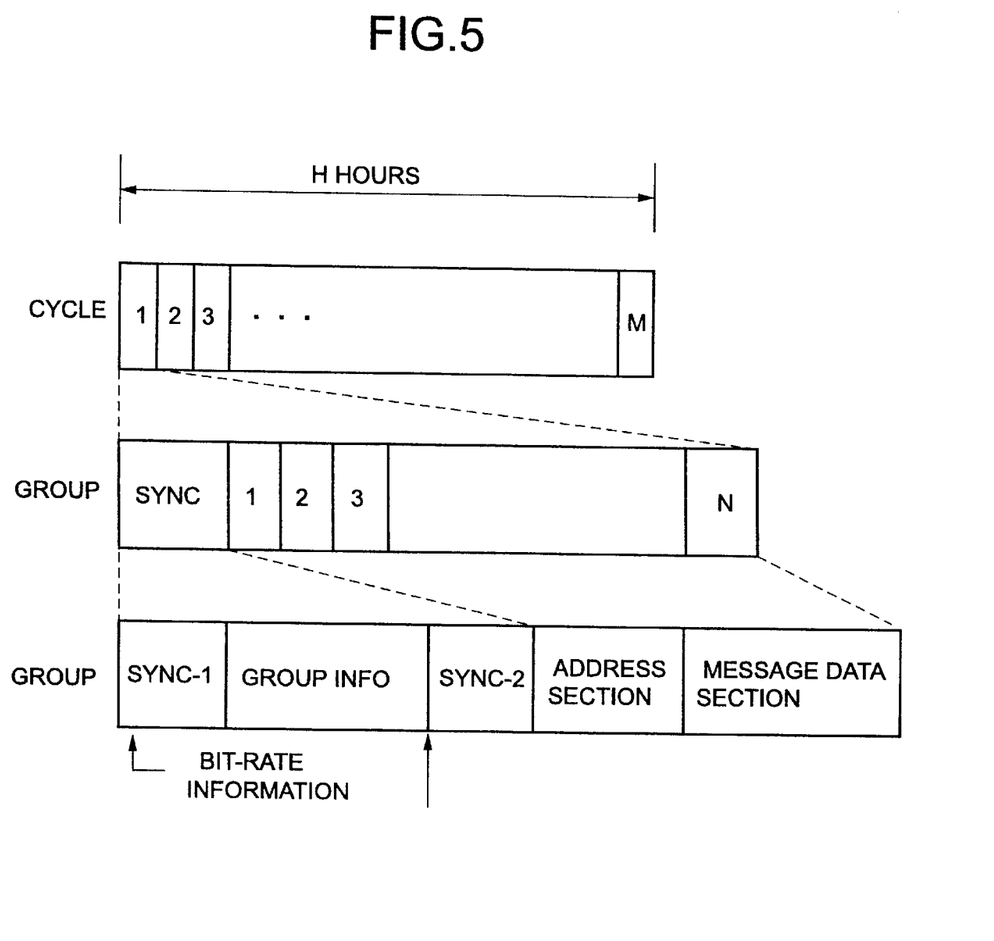
FIG. 5 is a schematic format diagram illustrating a radio selection call signal that is received by the embodiment.

As shown in FIG. 5, a cycle of H hours is divided into M groups, each of which is further divided into a sync section and N blocks. The sync section of each group consists of a first sync section (SYNC-1), a group information section and a second sync section (SYNC-2). The first sync section (SYNC-1) is received at a beginning bit rate and contains bit-rate change information. In the case of bit-rate change, the second sync section (SYNC-2) is used to establish the synchronization at the changed bit rate. The N blocks are divided into an address section and a message data section. In this embodiment, the beginning bit rate is 1600 bps and the bit rate of the second sync section (SYNC-2) is changed to 3200 bps or 6400 bps by the bit-rate change information contained in the first sync section (SYNC-1). Next, taking the signal format illustrated in FIG. 5 as an example, an operation of this embodiment will be explained in detail.

Figure 6:
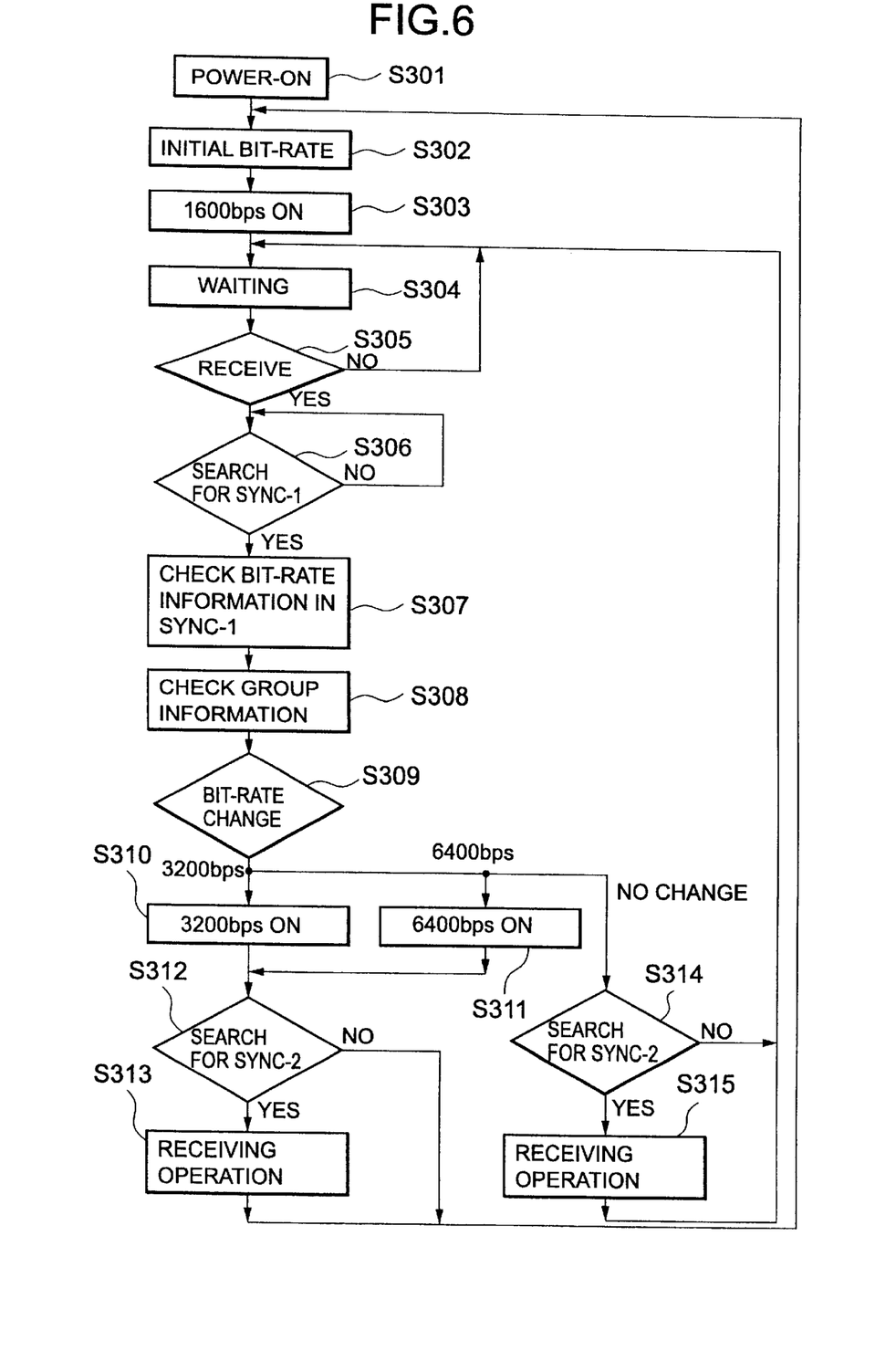
FIG. 6 is a flow chart illustrating an example of the operation of the embodiment.

Referring to FIG. 6, when the power supply switch 106 Is closed (step S301). the processor 103 sets the bit-rate discriminator 107 to an initial bit rate (here 1600 bps) (step S302). As a result of this, the bit-rate switch 108 sets the demodulator 102 to the initial bit rate and makes only the bit-rate switch signal $S_{SW1}$ high in level to thereby make only the NPN transistor Q2 of the control switch circuit 110 In ON state (step S303) as previously described. Therefore, the gain control is performed according to the curve A of FIG. 3.

In this state, the processor 103 performs the intermittent reception control and waits for a received signal (step S304. step S305). Namely, at the time of BS-OFF, the received signal $S_R$ is output from the radio system 101 and the level of this signal is detected by the received signal level detector 109 and is used for the gain control as previously stated. Further, the received signal $S_R$ is demodulated by the demodulator 102 into a base band signal, which is output to the processor 103. Upon input of the received signal from the demodulator 102 (YES in step S305), first, the first sync section SYNC-1 is searched for from the received signal (step S306).

Upon detection of the first sync section SYNC-1 (YES in step S306), the bit-rate discriminator 107 checks the presence or absence of the bit-rate change information in the first sync section SYNC-1 (step S307). Further, the processor 103 checks the group information following the first sync section SYNC-1 (step S308). Thereafter, the processor 103 confirms the group to be received by this receiver referring to ID-ROM 104 and then determined which group should be received at the subsequent timing.

The bit rate change information that has been read by the first sync section SYNC-1 is sent to the bit-rate discriminator 107. The bit-rate discriminator 107 sends out the changed bit rate to the bit-rate switch 108. As a result, the bit rates of the demodulator 102 and control switch circuit 110 are each switched to the changed bit rate as previously stated (step S309). More specifically, when the bit rate is changed to 3200 bps, only the bit-rate switch signals $S_{SW2}$ is made to have a high level to thereby make only the NPN transistor Q3 alone of the control switch circuit 110 in ON state (step S310). Also, when the bit rate is changed to 6400 bps, only the bit-rate switch signal $S_{SW3}$ alone is made to have a high level to thereby make only the NPN transistor Q4 alone in ON state (step S311). Accordingly, the gain control is performed according to the curves B and C of FIG. 4.

Upon completion of the bit-rate switch operation in this way, the second sync section SYNC-2 is searched for with the use of the changed bit rate (step S312). When the second sync section SYNC-2 is found (YES in step 5312), reception processing is performed (step S313) and the flow is returned to step S302. Further, when the second sync section SYNC-2 fails to be found (NO in step S312), the flow is also returned to step S302 in which the bit-rate discriminator 107 is set to the initial bit rate. Thereafter, according to the information confirmed with the group information that was received previously, the radio system 101 is powered on, i.e., brought to the (BS-OFF) state, thereby performing its receiving operation again.

In a case where it has been determined in step S309 that no change is made in the bit rate, the 1600 bps bit rate which is the initial bit rate is maintained and as a result the second sync section SYNC-2 is searched for with the use of this bit rate (step S314). When the second sync section SYNC-2 is detected, reception processing is performed (step S315) and the flow is returned to step S304 in which the processor 103 enters into a waiting state for reception of the next group. Further, in a case where the second sync section SYNC-2 fails to be found, the flow is also returned to step S304 in which entry is similarly made into a waiting state.

Figure 7:
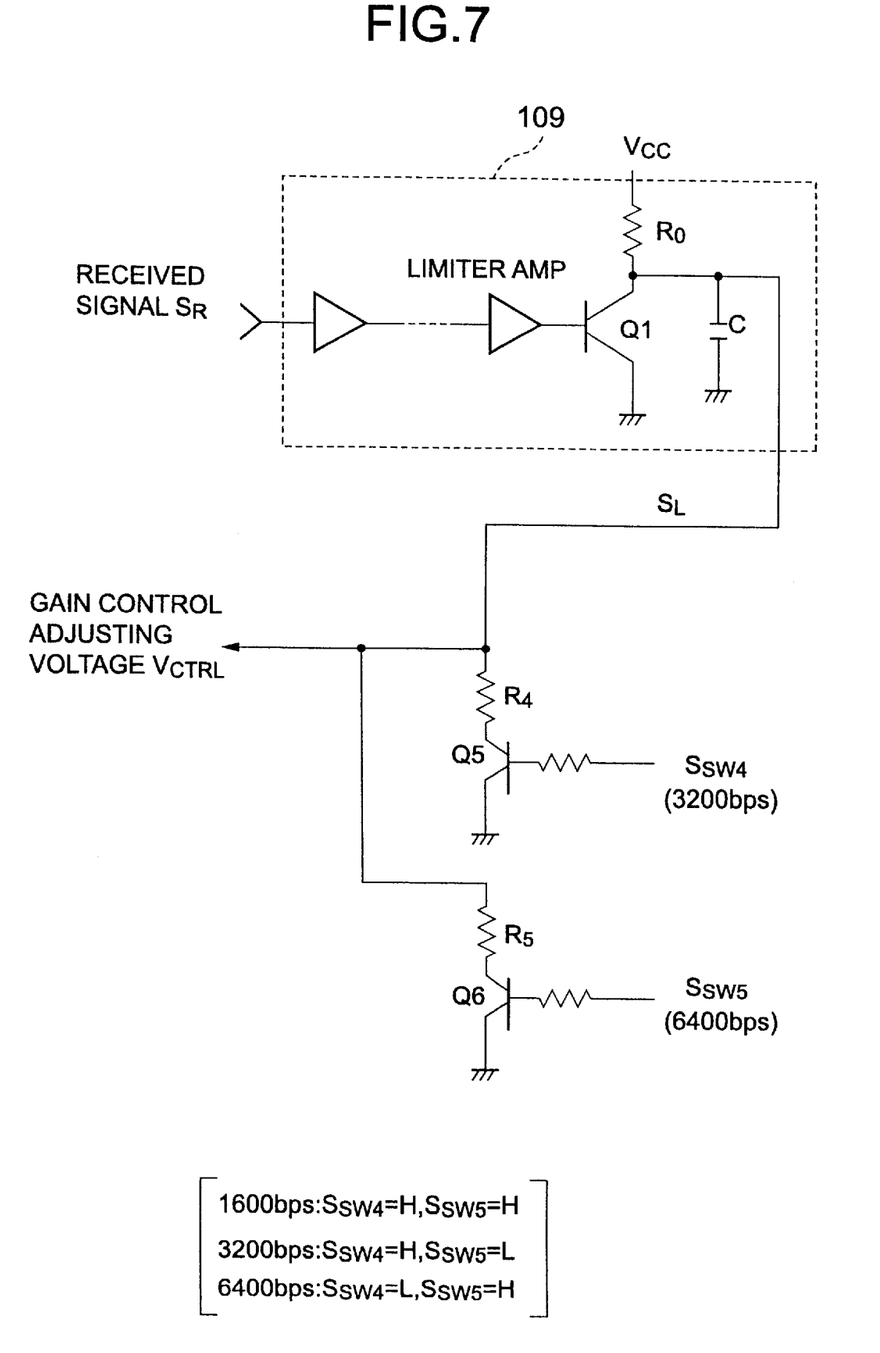
FIG. 7 is a detailed circuit diagram illustrating another example of the control switch circuit 110.

Referring to FIG. 7, the control switch circuit 110 may have another circuit configuration, which is composed of NPN transistors Q5 and Q6 and resistors R4 and R5 having different resistance values. Since the fundamental circuit configuration thereof is the same as that of the circuit illustrated in FIG. 2, an explanation thereof will be omitted.

Here, the bit-rate switch 108 discriminates the three bit rates (1600 bps, 3200 bps and 6400 bps) from one another by a combination of the two bit-rate switch signals $S_{SW4}$ and $S_{SW5}$. Namely, when it has been determined that the bit rate of the received signal is 1600 bps, both of the bit-rate switch signals $S_{SW4}$ and $S_{SW5}$ are made to have a high level to thereby make both the NPN transistors Q5 and Q6 in on state. When the bit rate of the received signal is 3200 bps and when the bit rate thereof is 6400 bps, only the bit-rate switch signal $S_{SW4}$ alone and only the bit-rate switch signal Ssws alone are respectively made to go high. By making this construction in this way, also, it is possible to obtain the similar effects as those attainable with the circuit construction illustrated in FIG. 2.

As has been explained above in detail, the gain control circuit and method according to the present invention makes it possible to change the received signal level at which the operation for gain control is started in correspondence with the bit rate. For this reason, the optimum gain control can be achieved regardless of whether the bit rate is high. Further, since there is no need to provide the attenuator for each bit rate, the invention contributes also to reduce the receiver apparatus in size and weight.

What is claimed is:

1. In a radio receiver having a variable-gain amplifier for amplifying a radio-frequency signal having at least one of a plurality of predetermined transmission rates, a gain control method, comprising the steps of:
   a) detecting a received signal level from a received signal amplified by the variable-gain amplifier;
   b) determining a transmission rate of the received signal based on bit rate information detected from the received signal; and
   c) controlling a gain of the variable-gain amplifier depending on a gain control adjusting signal produced based on the received signal level and the transmission rate of the received signal, wherein the step of controlling comprises the steps of:
      c-1) changing the received signal level depending on the transmission rate of the received signal to produce the gain control adjusting signal, wherein the changing step comprising the steps of:
         determining an amount of change depending on the transmission rate of the received signal so as to cancel out a change of the received signal level caused by a change of the transmission rate; and
         changing the received signal level according to a selected gain control characteristic to produce the gain control adjusting signal; and
      c-2) controlling the gain of the variable-gain amplifier depending on the gain control adjusting signal, wherein the gain of the variable-gain amplifier is controlled when a level of the gain control adjusting signal is higher than a predetermined level regardless of the transmission rate.

2. In a radio receiver having a variable-gain amplifier for amplifying a radio-frequency signal having at least one of a plurality of predetermined transmission rates, a gain control method, comprising the steps of:
   a) detecting a received signal level from a received signal amplified by the variable-gain amplifier;
   b) determining a transmission rate of the received signal based on bit rate information detected from the received signal; and
   c) controlling a gain of the variable-gain amplifier depending on a gain control adjusting signal produced based on the received signal level and the transmission rate of the received signal, wherein the step of controlling comprises the steps of:
      c-1) changing the received signal level depending on the transmission rate of the received signal to produce the gain control adjusting signal, wherein the changing step comprising the steps of:
         selecting one of a plurality of gain control characteristics depending on the transmission rate of the received signal, the gain control characteristics corresponding to the predetermined transmission rates, respectively; and
         changing the received signal level according to a selected gain control characteristic to produce the gain control adjusting signal; and
      c-2) controlling the gain of the variable-gain amplifier depending on the gain control adjusting signal.

3. The gain control method according to claim 2, wherein the gain control characteristics are predetermined such that a change of the received signal level caused by a change of each transmission rate is canceled out.

4. The gain control method according to claim 2, wherein in the step c-2), the gain of the variable-gain amplifier is controlled when a level of the gain control adjusting signal is higher than a predetermined level regardless of the transmission rate.

5. A gain control circuit for controlling a variable-gain amplifier for amplifying a radio-frequency signal having at least one of a plurality of predetermined transmission rates provided in a radio receiver, comprising:
   a detector for detecting a received signal level from a received signal amplified by the variable-gain amplifier;
   a discriminator for determining the transmission rate of the received signal based on bit rate information detected from the received signal; and
   a controller for controlling a gain control adjusting signal produced based on the received signal level and the transmission rate of the received signal, wherein the controller comprises:
      a gain control adjuster for changing the received signal level depending on the transmission rate of the received signal to produce the gain control adjusting signal, wherein the gain control adjuster comprises:
         a determiner for determining an amount of change depending on the transmission rate of the received signal so as to cancel out a change of the received signal level caused by a change of the transmission rate; and
         a level changer for changing the received signal level by the amount of change to produce the gain control adjusting signal; and
      a gain controller for controlling the gain of the variable-gain amplifier depending on the gain control adjusting signal, wherein the gain controller controls the gain of the variable-gain amplifier when a level of the gain control adjusting signal is higher than a predetermined level regardless of the transmission rate.

6. A gain control circuit for controlling a variable-gain amplifier for amplifying a radio-frequency signal having at least one of a plurality of predetermined transmission rates provided in a radio receiver, comprising:
   a detector for detecting a received signal level from a received signal amplified by the variable-gain amplifier;

a discriminator for determining the transmission rate of the received signal based on bit rate information detected from the received signal; and a controller for controlling a gain control adjusting signal produced based on the received signal level and the transmission rate of the received signal, wherein the controller comprises:

a gain control adjuster for changing the received signal level depending on the transmission rate of the received signal to produce the gain control adjusting signal, wherein the gain control adjuster comprises:

a selector for selecting one of a plurality of gain control characteristics depending on the transmission rate of the received signal, the gain control characteristics corresponding to the predetermined transmission rates, respectively; and a level changer for changing the received signal level according to a selected gain control characteristic to produce the gain control adjusting signal; and a gain controller for controlling the gain of the variable-gain amplifier depending on the gain control adjusting signal.

7. The gain control circuit according to claim 6, wherein the gain control characteristics are predetermined such that a change of the received signal level caused by a change of each transmission rate is canceled out.

8. The gain control circuit according to claim 6, wherein the gain controller controls the gain of the variable-gain amplifier when a level of the gain control adjusting signal is higher than a predetermined level regardless of the transmission rate.

9. A radio receiver, comprising:

a variable-gain amplifier for amplifying a radio-frequency signal having at least one of a plurality of predetermined transmission rates;

a demodulator for demodulating a received signal amplified by the variable-gain amplifier to produce received data;

a detector for detecting a received signal level from the received signal amplified by the variable-gain amplifier;

a discriminator for determining the transmission rate of the received signal based on bit rate information detected from the received signal; and a controller for controlling a gain of the variable-gain amplifier depending on a gain control adjusting signal produced based on the received signal level and the transmission rate of the received signal, wherein the controller comprises:

a gain control adjuster for changing the received signal level depending on the transmission rate of the received signal to produce the gain control adjusting signal, wherein the gain control adjuster comprises:

a determiner for determining an amount of change depending on the transmission rate of the received signal so as to cancel out a change of the received signal level caused by a change of the transmission rate; and a level changer for changing the received signal level according to a selected gain control characteristic to produce the gain control adjusting signal; and a gain controller for controlling the gain of the variable-gain amplifier depending on the gain control adjusting signal, wherein the gain controller controls the gain of the variable-gain amplifier when a level of the gain control adjusting signal is higher than a predetermined level regardless of the transmission rate.

10. A radio receiver, comprising:

a variable-gain amplifier for amplifying a radio-frequency signal having at least one of a plurality of predetermined transmission rates;

a demodulator for demodulating a received signal amplified by the variable-gain amplifier to produce received data;

a detector for detecting a received signal level from the received signal amplified by the variable-gain amplifier;

a discriminator for determining the transmission rate of the received signal based on bit rate information detected from the received signal; and a controller for controlling a gain of the variable-gain amplifier depending on a gain control adjusting signal produced based on the received signal level and the transmission rate of the received signal, wherein the controller comprises:

a gain control adjuster for changing the received signal level depending on the transmission rate of the received signal to produce the gain control adjusting signal, wherein the gain control adjuster comprises:

a selector for selecting one of a plurality of gain control characteristics depending on the transmission rate of the received signal, the gain control characteristics corresponding to the predetermined transmission rates, respectively; and a level changer for changing the received signal level according to a selected gain control characteristic to produce the gain control adjusting signal; and a gain controller for controlling the gain of the variable-gain amplifier depending on the gain control adjusting signal.

11. The radio receiver according to claim 10, wherein the gain control characteristics are predetermined such that a change of the received signal level caused by a change of each transmission rate is canceled out.

* * * * *